United States Patent [19]

Noguchi et al.

[11] Patent Number: 5,043,363
[45] Date of Patent: Aug. 27, 1991

[54] ACTIVE ENERGY RAY-CURING RESIN COMPOSITION

[75] Inventors: Hiromichi Noguchi, Atsugi; Tadayoshi Inamoto, Machida; Megumi Munakata, Atsugi, all of Japan

[73] Assignee: Canon Kabushiki Kaisha, Tokyo, Japan

[21] Appl. No.: 581,084

[22] Filed: Sep. 12, 1990

Related U.S. Application Data

[63] Continuation of Ser. No. 246,931, Sep. 19, 1988, abandoned, which is a continuation of Ser. No. 871,877, Jun. 9, 1986, abandoned.

[30] Foreign Application Priority Data

Jun. 13, 1985 [JP] Japan ............................ 60-127125

[51] Int. Cl.$^5$ .................. C08F 2/50; C08F 226/00; C08F 220/20; C08G 59/17
[52] U.S. Cl. ........................................ 522/95; 522/9; 522/102; 522/106; 522/194; 522/121; 525/112; 525/118; 430/284
[58] Field of Search ................ 522/102, 95, 106, 121; 525/92, 94, 118

[56] References Cited

U.S. PATENT DOCUMENTS

| | | | |
|---|---|---|---|
| 3,382,297 | 5/1968 | Thompson | 525/94 |
| 3,450,613 | 6/1969 | Steinberg | 522/103 |
| 3,607,977 | 9/1971 | Taylor | 525/94 |
| 3,655,826 | 4/1972 | Fellman et al. . | |
| 3,711,575 | 1/1973 | Kakefuda et al. . | |
| 3,764,324 | 10/1973 | Reyes | 522/102 |
| 4,125,503 | 11/1978 | McCarty | 522/103 |
| 4,148,967 | 4/1979 | Satoh | 522/102 |
| 4,163,809 | 8/1979 | McGinniss | 522/102 |
| 4,181,581 | 1/1980 | Iwata | 525/94 |
| 4,299,938 | 11/1981 | Green | 522/31 |
| 4,343,919 | 8/1982 | Tefertiller | 522/96 |
| 4,366,289 | 12/1982 | Keskkula | 525/94 |
| 4,393,670 | 7/1982 | Sugitani et al. . | |
| 4,412,224 | 10/1983 | Sugitani . | |
| 4,417,251 | 11/1983 | Sugitani . | |
| 4,424,100 | 1/1984 | McCarty | 522/103 |
| 4,429,076 | 1/1984 | Saito | 525/94 |
| 4,437,100 | 3/1984 | Sugitani et al. . | |
| 4,509,063 | 4/1985 | Sugitani et al. . | |
| 4,521,787 | 6/1985 | Yokota et al. . | |
| 4,524,183 | 6/1985 | Weber | 525/118 |
| 4,533,975 | 8/1985 | Bill . | |
| 4,554,322 | 11/1985 | Kwiecinski . | |
| 4,593,067 | 6/1986 | Nakayama | 525/92 |
| 4,688,052 | 8/1987 | Inamoto et al. . | |
| 4,688,053 | 8/1987 | Noguchi et al. . | |
| 4,688,054 | 8/1987 | Inamoto et al. . | |
| 4,688,055 | 8/1987 | Noguchi et al. . | |
| 4,688,056 | 8/1987 | Noguchi et al. . | |

FOREIGN PATENT DOCUMENTS

| | | |
|---|---|---|
| 2411753 | 10/1975 | Fed. Rep. of Germany . |
| 2610437 | 9/1976 | Fed. Rep. of Germany . |
| 47-47865 | 2/1972 | Japan . |
| 57-87409 | 5/1982 | Japan . |

*Primary Examiner*—Marion E. McCamish
*Assistant Examiner*—Arthur H. Koeckert
*Attorney, Agent, or Firm*—Fitzpatrick, Cella, Harper & Scinto

[57] ABSTRACT

An active energy ray-curing resin composition comprises (i) a heat-crosslinkable linear copolymer comprising 5 to 30 mol % of a monomer represented by the general formula I shown below and 5 to 50 mol % of a monomer represented by the general formula II shown below as the copolymer constituents:

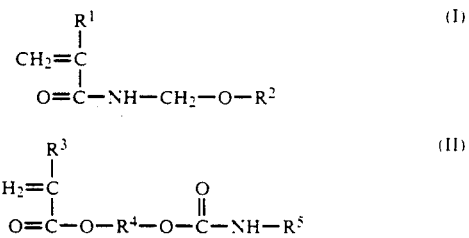

(wherein $R^1$ is hydrogen or alkyl or hydroxyalkyl group having 1 to 3 carbon atoms; $R^2$ is hydrogen or alkyl or acyl group having 1 to 4 carbon atoms which may have a hydroxyl group; $R^3$ is hydrogen or alkyl group having 1 to 3 carbon atoms; $R^4$ is a divalent hydrocarbon group which may have internally an ether bond and may also be substituted with halogen atoms; and $R^5$ is alkyl having 3 to 12 carbon atoms or phenylalkyl group or phenyl group), and (ii) a monomer having an ethylenically unsaturated bond.

5 Claims, No Drawings

ACTIVE ENERGY RAY-CURING RESIN COMPOSITION

This application is a continuation of application Ser. No. 07/246,931, filed Sept. 19, 1988, now abandoned, which is a continuation of application Ser. No. 06,/871,877, filed June 9, 1986, now abandoned.

BACKGROUND OF THE INVENTION

1. Field of the Invention

This invention relates to a resin composition which can be cured by irradiation of an active energy ray, such as UV-ray, electron beam, etc., particularly to an active energy ray curing type resin composition which is excellent in adhesion to substrates, such as glass, ceramics, plastic films, etc., chemical resistance and mechanical strength, and is capable of forming a pattern thereon. The active energy ray-curing resin composition is a resin composition which can be formed into a solid photosensitive sheet (dry film). Curing is effected specifically by irradiation of an active energy ray and subsequent heating.

2. Related Background Art

In recent years, active energy ray curing resins have been frequently used as coating materials, inks, sealing materials, resist materials, and pattern forming materials. Active energy ray-curing resins as pattern forming materials have been used for preparation of printing plates at the initial stage, but they have been recently utilized also for construction materials for precise instruments such as inkjet recording heads as disclosed in Japanese Laid-open Patent Application No. 57-43876, in addition to having been utilized in electronic industries such as print wirings, integrated circuits, etc.

However, among the active energy ray-curing resins used for pattern formation heretofore known, particularly among those of dry film type, there has been no resin excellent in adhesion to substrates such as glass, ceramics or plastic films, etc. On the other hand, those which are known as photocurable type coating materials or adhesives to be used for glass, metals, ceramics, etc. are excellent in adhesion, but irradiation of a strong active energy ray or prolonged irradiation is required, and yet they generally do not have suitable properties for pattern formation. Thus, even if it was attempted to obtain a pattern by irradiating an active energy ray in a pattern by use of these materials and removing the non-exposed portion by development, it was impossible to obtain a pattern of high precision and high resolution.

As described above, in the prior art, there has been no material which is capable of forming a precise pattern with excellent adhesion on various substrates, and which pattern has also high durability as the construction material.

SUMMARY OF THE INVENTION

An object of the present invention is to provide an active energy ray-curing resin composition which could not be accomplished by the active energy ray-curing resin of the prior art as described above, which is excellent in adhesion to a substrate and can form a precise and high resolution pattern.

Another object of the present invention is to provide an active energy ray-curing resin composition, which can be formed into a dry film convenient for formation of a pattern, and can also give a pattern formed by curing with irradiation of an active energy ray and subsequent heating which is excellent in chemical resistance and mechanical strength, and also has high durability as the construction material.

According to the present invention, there is provided an active energy ray-curing resin composition comprising (i) a heat-crosslinkable linear copolymer containing 5 to 30 mol % of a monomer represented by the general formula I shown below and 5 to 50 mol % of a monomer represented by the general formula II shown below as the copolymer constituents:

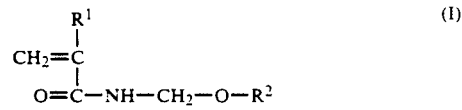

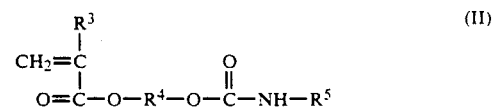

(wherein $R^1$ is hydrogen or alkyl or hydroxyalkyl group having 1 to 3 carbon atoms; $R^2$ is hydrogen or alkyl or acyl group having 1 to 4 carbon atoms which may have a hydroxyl group; $R^3$ is hydrogen or alkyl group having 1 to 3 carbon atoms; $R^4$ is a divalent hydrocarbon group which may have internally an ether bond and may also be substituted with halogen atoms; and $R^5$ is alkyl having 3 to 12 carbon atoms or phenylalkyl group or phenyl group), and (ii) a monomer having an ethylenically unsaturated bond.

DESCRIPTION OF THE PREFERRED EMBODIMENTS

The heat-crosslinkable linear copolymer (i) which is an essential component of the active energy ray-curing resin composition of the present invention has 5 to 30 mol % of a monomer of the above formula I having hydrophilic property and heat-crosslinkability and 5 to 50 mol % of a monomer of the above formula II for imparting sufficient adhesiveness and mechanical strength to the pattern obtained by curing the composition as the components for copolymerization, respectively. Excellent adhesiveness to a substrate can be exhibited due to the above hydrophilic property, and also excellent properties as structural materials such as heat resistance, chemical resistance, mechanical strength, etc. can be exhibited by heat crosslinkability. The monomers represented by the above formulae I and II should preferably be contained in the heat cross-linkable linear copolymer at a proportion of about 5 mol % or more as their total amounts.

Specific examples of the monomer represented by the formula I to be used in construction of the above heat crosslinkable linear copolymer may include acrylamide derivatives such as N-methylol(meth)acrylamide (hereinafter the expression (meth)acrylamide means including both acrylamide and methacrylamide) N-propoxymethyl(meth)acrylamide, N-n-butoxymethyl(meth)acrylamide, β-hydroxyethoxymethyl(meth)acrylamide, N-ethoxymethyl(meth)acrylamide, N-methoxymethyl(meth)acrylamide, N-acetoxymethyl(meth)acrylamide, α-hydroxymethyl-N-methylolacrylamide, α-hydroxyethyl-N-butoxymethylacrylamide, α-hydroxypropyl-N-propoxymethyl acrylamide, α-ethyl-N-methylol acrylamide, α-propyl-N-methylolacrylamide and the like.

These monomers represented by the formula I are required to be contained at a proportion of 5 to 30 mol % in the heat crosslinkable linear copolymer. With a content less than 5 mol %, sufficient chemical resistance cannot be imparted to the pattern obtained by curing of the composition of the present invention. On the other hand, if the content exceeds 30 mol %, the pattern obtained by curing becomes brittle.

On the other hand, the monomer represented by the formula II is required to be contained at a proportion of 5 to 50 mol % in the heat crosslinkable linear copolymer. With a content less than 5 mol %, sufficient adhesiveness and mechanical strength cannot be imparted to the pattern obtained by curing of the composition of the present invention. On the contrary, if the content exceeds 50 mol %, the composition obtained will be markedly lowered in softening point, whereby there will ensue the problems such as lowering in surface hardness or deterioration in chemical resistance by swelling of the pattern obtained by curing the composition.

$R^4$ in the monomer represented by the formula II to be used in the present invention can be any divalent hydrocarbon group which may have internally an ether bond and also may be substituted with halogen atoms. Preferable examples of $R^4$ include alkylene groups having 2 to 12 carbon atoms which may be substituted with halogen atoms, alicyclic hydrocarbon groups such as 1,4-bismethylenecyclohexane, and hydrocarbon groups containing atomatic ring such as bisphenyldimethylmethane.

Specific examples of the monomer represented by the formula II to be used in the present invention include (α-alkyl)acrylic acid esters having one or more urethane bond in one molecule comprising reaction products obtained by the reaction of (α-alkyl)acrylic acid esters having one hydroxyl group in one molecule with monoisocyanate compounds. Examples of (meth)acrylic acid esters having at least one hydroxyl group in one molecule to be used in preparation of the monomer represented by the above formula II include 2-hydroxyethyl (meth)acrylate, 2-hydroxypropyl (meth)acrylate, 3-chloro-2-hydroxypropyl (meth)acrylate, 4-hydroxybutyl (meth)acrylate, 3-hydroxybutyl (meth)acrylate, 5-hydroxypentyl (meth)acrylate, 6-hydroxyhexyl (meth)acrylate or Light Ester HO-mpp (produced by Kyoeisha Yushi Kagaku Kogyo K.K.). As the (α-alkyl)acrylic acid ester having one hydroxyl group in one molecule, (a) esters of aliphatic or aromatic divalent alcohols with (meth)acrylic acids and (b) (meth)acrylic acid esters of monoepoxy compounds can be similarly used.

Examples of the divalent alcohol to be used in the above (a) may include 1,4-cyclohexanedimethanol, 1,10-decanediol, neopentylglycol, bis(2-hydroxyethyl)-terephthalate, addition reaction products of 2 to 10 mols of ethyleneoxide or propyleneoxide added to bisphenol A. On the other hand, the monoepoxy compounds to be used in the above (b) may include Eporite M-1230 (trade name, produced by Kyoeisha Yushi Kagaku Kokyo, K.K.), phenylglycidyl ether, cresylglycidyl ether, butylglycidyl ether, octylene oxide, n-butylphenol glycidyl ether, etc.

As the monoisocyanate compound to be used in preparation of the monomer represented by the formula II, there may be included alkyl monoisocyanates comprising one isocyanate group added to alkyl groups having 3 to 12 carbon atoms and phenyl isocyanate, cresyl monoisocyanate and the like.

These monomers represented by the formula II can be prepared easily by carrying out the reaction between an acrylic acid ester having one hydroxyl group in one molecule and a monoisocyanate compound in the presence of a catalyst such as dibutyl tin dilaurate.

The monomer represented by the formula I to be used in construction of the heat-crosslinkable linear copolymer in the present invention has hydrophilic property and imparts firm adhesiveness to the composition of the present invention when it adheres to substrates such as glass, ceramics, plastic, etc. The monomer represented by the above formula I also has condensing crosslinkability by heating and will generally form crosslinks through elimination of water molecules or alcohol at a temperature of 100° C. or higher to thereby form a network structure in the heat crosslinkable copolymer itself after curing, whereby excellent chemical resistance and mechanical strength can be imparted to the pattern obtained by curing.

In the heat-crosslinkable linear copolymer in the composition of the present invention, in addition to the monomers represented by the above formulae I and II, various monomers generally used in preparation of acrylic resins, vinyl resins, etc., can be used as the components for copolymerization in amounts within the range of from 20 to 90 mol %. These monomers can be used for various purposes such as imparting high agglomeration strength (cohesive strength) to the composition of the present invention, etc.

The composition of the present invention can be provided in various forms depending on the purpose of use, such as a solution or a solid film, etc. If it is to be applied as a dry film, in order to maintain the composition in the form of a film, it is preferable to use a heat-crosslinkable linear copolymer obtained by copolymerization of a monomer giving relatively rigid properties having a glass transition temperature of about 50° C. in addition to the monomers of the formulae I and II. Examples of the monomer other than those of the formulae I and II to be used in preparation of a heat-crosslinkable linear copolymer suitable for such a purpose may include alkyl methacrylates having 1 to 4 carbon atoms in the alkyl group such as methyl methacrylate, ethyl methacrylate, isobutyl methacrylate, t-butyl methacrylate and the like, acrylonitrile, isobornyl methacrylate, isobornyl acrylate, styrene, etc., of which homopolymers have a glass transition temperature of about 50° C. or higher. Of course, these monomers can be used by selecting suitably at least one of them. Further, in addition to these monomers, other known monomers having hydroxy group, amino group, carboxyl group or glycidyl group or monomers of which polymers have a glass transition temperature lower than about 50° C. may be suitably selected and used.

The above hydroxyl containing monomer may be exemplified by 2-hydroxyethyl (meth)acrylate, 3-chloro-2-hydroxy (meth)acrylate and the like, and the amino containing monomer such as N.N-dimethylaminoethyl (meth)acrylate, (meth)acrylamide, N,N-dimethylaminoethyl(math)acrylamide, N,N-dimethyl(-meth)acrylamide, N,N-dimethylaminopropyl(meth)acrylamide, N,N-di-t-butylaminoethyl(meth) acrylamide and the like. Examples of the carboxyl containing monomer may include (meth)acrylic acid, fumaric acid, itaconic acid or those known under the trade names Aronix M-5400, Aronix M-5500, etc., which are products of Toa Gosei Kagaku K.K., and the monomer having glycidyl group may include glycidyl (meth)acrylate, etc.

On the other hand, when the composition of the present invention is to be used in a solution, it is also possible to employ a heat-crosslinkable linear copolymer having a low glass transition temperature which can give flexibility to the composition. However, also in this case, in order to obtain a pattern having excellent chemical resistance and high mechanical strength, it is preferable to use a heat-crosslinkable linear copolymer having a high glass transition temperature.

Anyway, the heat-crosslinkable linear copolymer to be used in the present invention enables precise patterning by imparting form retentivity to the composition in the curing step of the composition (namely formation of a pattern by irradiation of active energy ray and subsequent heat curing), and also gives excellent adhesiveness, chemical resistance and high mechanical strength to the pattern obtained by curing.

The monomer (ii) having an ethylenically unsaturated bond to be used as another component in the composition of the present invention is a component for permitting the composition of the present invention to exhibit curability with an active energy ray, preferably having a boiling point of 100° C. or higher under atmospheric pressure, preferably also having two or more ethylenically unsaturated bonds, and various known monomers curable by irradiation of an active energy ray can be used.

Specific examples of such monomers having two or more ethylenically unsaturated bonds include ⓐ acrylic acid esters or methacrylic acid esters of polyfunctional epoxy resins having two or more epoxy groups in one molecule, ⓑ acrylic acid esters or methacrylic acid esters of alkyleneoxide addition products of polyhydric alcohols, ⓒ polyester acrylates having acrylic acid ester group at the terminal ends of the molecular chains of polyesters having molecular weights of 500 to 3000 comprising dibasic acid and dihydric alcohol, ⓓ the reaction products between polyisocyanates and acrylic acid monomers having hydroxyl groups. The above monomers ⓐ-ⓓ may be urethane-modified products having urethane bonds in the molecules.

Examples of the monomers belonging to ⓐ include acrylic acid or methacrylic acid esters of epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula III:

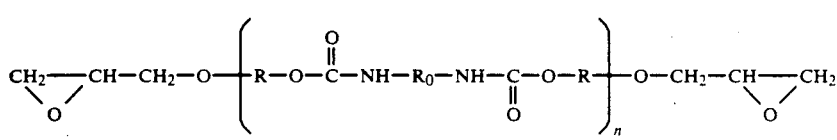

(wherein R represents an alkyl group or an oxyalkyl group, $R_0$ represents

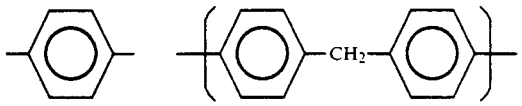

or an alkyl group).

Examples of the monomers belonging to ⓑ include ethyleneglycol di(meth)acrylate, diethyleneglycol (meth)acrylate, polyethyleneglycol di(meth)acrylate, 1,6-hexanediol (meth)acrylate, polyethyleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K.K.), and also those known under the trade names of NK ester BPE-200, BPE-500, BPE-1300, A-BPE-4 (all produced by Shin Nakamura Kagaku K.K.), etc., may also be available.

The monomers belonging to ⓒ may be exemplified by those known under the trade names of Aronix M-6100, M-6200, M-6250, M-6300, M-6400, M-7100, M-8030, M-8060, M-8100 (all produced by Toa Gosei Kagaku K.K.). Examples of the monomers belonging to ⓑ and having urethane bonds of polyester include those known under the trade names of Aronix M-1100, Aronix M-1200, (both produced by Toa Gosei Kagaku K.K.).

The monomers belonging to ⓓ may include the reaction products between polyisocyanate such as tolylene diisocyanate, isophorone diisocyanate, hexamethylene diisocyanate, trimethylhexamethylene diisocyanate, lysine diisocyanate, diphenylmethane diisocyanate or the like with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K.K.), etc. The hydroxyl containing acrylic monomer as herein mentioned may include typically (meth)acrylic acid esters, preferably hydroxyethyl acrylate, hydroxyethyl methacrylate, hydroxypropyl acrylate. It is also possible to use other acrylic monomers containing hydroxyl group(s) previously mentioned for preparation of the monomer represented by the formula I in the heat-crosslinkable linear copolymer.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2-C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacryllate, polypropyleneglycol monomethacrylate or the like; $C_1-C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractone-modified hydroxyalkyl(meth)acrylate, tetrahydrofurfulyl acrylate, phenoxyethyl acrylate; and others.

Anyway, by use of the above monomer having ethylenically unsaturated bonds, curability to an active energy ray can be imparted to the composition of the present invention.

The active energy ray to be used for curing of the active energy ray-curing resin composition of the present invention may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20M Rad is practically suitable.

The active energy ray-curing resin composition of the present invention can be cured by the active energy ray as described above, and it is preferable to add thereto a photopolymerization initiator when employing an active energy ray with wavelength of 250 nm to 450 nm. As the photopolymerization initiator, known substances can be used without any particular limitation.

Specific examples of such photopolymerization initiators include benzil, benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis(N,N-diethylamino)benzophenone, benzophenone methyl ether and the like; anthraquinones such as 2-ethylanthraquinone, 2- t-butylanthraquinone and the like; xanthones such as 2,4-dimethylthioxanthone, 2,4-diisopropylthioxanthone and the like; acetophenones such as 2,2-dimethoxy-2-phenylacetophenone, α, α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irgacure 184, produced by Ciba Geigy Co.), 1-(4-isopropylphenyl)-2-hydroxy-2-methylpropane-1-one (e.g. Darocure 1116, produced by MERCK Co.), 2-hydroxy-2-methyl-1-phenylpropane-1-one (Darocure 1173, produced by MERCK CO.); etc., as preferable ones. In addition to these photopolymerication initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamylester, etc.

The constitutional ratio of the above materials constituting the active energy ray-curing resin composition of the present invention may be made 20 to 80 wt. %, preferably 20 to 50 wt. % for the heat crosslinkable linear copolymer and 80 to 20 wt. %, preferably 50 to 80 wt. % for the monomer having ethylenically unsaturated bonds.

When a photopolymerization initiator is used in the resin composition of the present invention, the photopolymerization initiator may be used in an amount within the range from 0.1 to 20 parts by weight, preferably from 1 to 10 parts by weight based on 100 parts by weight of the resin components comprising the heat-crosslinkable linear copolymer and the monomer having ethylenically unsaturated bonds.

As the solvent to be used when employing the active energy ray-curing resin composition of the present invention in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the composition of the present invention.

The active energy ray-curing resin composition of the present invention may further contain in addition to the above photopolymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil-soluble dyes and pigments within the range which do not substantially prevent transmission of the active energy ray. As the filter, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used in the composition of the present invention.

The active energy ray-curing resin composition of the present invention can be used for protective coating of glass, adhesive, insulating layer of liquid crystal display devices or surface modification such as transparent coloration or opaque coloration on glass plate, imparting of water-proofness, water repellency, anti-stain property, etc. Also, by making available excellent chemical resistance, it is useful as the masking material for glass etching or metallizing such as electroless copper plating, etc., solder mask for printed-wiring board, etc. It is also useful for formation of minute liquid pathways, cooling pathways or nozzles utilizing water resistance, particularly for formation of nozzles in ink-jet recording heads. Further, it is possible to obtain a photosensitive liquid or dry film for screen process printing which can be used for both aqueous and oily inks having high durability incomparable with other materials.

When the active energy ray-curing resin composition of the present invention is provided for various uses as mentioned above, it can be used according to the methods as exemplified below.

1) The composition of the present invention is applied on a substrate to a desired thickness within the range from 1 to 100 μm, the solvent is dried by evaporation and then an active energy ray is irradiated. Then, the substrate is heated at 100° C. or higher for about 5 minutes to 60 minutes.

2) The composition of the present invention is applied on a substrate to a desired thickness of 1 to 100 μm, followed by drying by evaporation of the solvent. Subsequently, a mask pattern with a transmittance of the active energy ray of at least 1% or less is closely contacted on the composition, and an active energy ray is irradiated from above the mask. Then, development is effected with a developer dissolving the composition to remove the non-irradiated portion. Then, the substrate is heated at a temperature of at least 100° C. for about 5 to 60 minutes.

The cured film obtained as described above is excellent in resolution as a matter of course, and also in adhesion to the substrate, mechanical strength, water resistance, chemical resistance and dimensional stability.

The active energy ray-curing resin composition of the present invention has very excellent sensitivity and resolution as a pattern forming material and can form a high density and high resolution pattern. Moreover, the pattern formed has excellent adhesion to the substrate, mechanical strength and chemical resistance when viewed as the coating material, and therefore it is useful for protective coating or structural material for which a long term durability is demanded.

The present invention is described in more detail by referring to the following Examples.

EXAMPLE 1

By solution polymerization of methyl methacrylate, N-methylol acrylamide and Nissocure UM-1M*1 in methylcellosolve (methyl methacrylate/N-methylol acrylamide/Nissocure UM-1M=50/25/25 molar ratio), a linear polymer having heat crosslinkability with a weight average molecular weight of $5.7 \times 10^4$ was obtained (this is called P-1).

*1 product name of Shin Nisso Kako K.K., which is a monomer having the structure shown below:

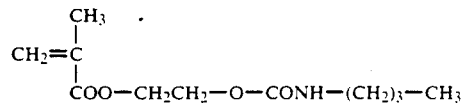

By use of the linear polymer P-1, an active energy ray-curing resin composition was prepared as follows.

| P-1 | 100 parts by weight |
| --- | --- |
| Light Ester 3002M*2 | 90 parts by weight |
| Pentaerythritol triacrylate | 60 parts by weight |
| Benzophenone | 9 parts by weight |
| Michler's ketone | 3 parts by weight |
| Paratoluene sulfonic acid | 2.5 parts by weight |
| Crystal Violet | 0.5 parts by weight |
| Methyl cellosolve | 250 parts by weight |

*2 methacrylic acid ester of epoxy resin produced by Kyoeisha Yushi Kagaku Kogyo K.K.

The composition was applied by a bar coater on a 10 cm × 10 cm Pyrex substrate which had been subjected to sonication cleaning treatment in a washing liquid Difron (produced by Daikin Kogyo K.K.) to a thickness of about 50 μm after drying. On the surface of this composition was laminated a polyethyleneterephthalate film (Lumilar T type) with a thickness of 16 μm. Then, by use of a mask for resolution test, exposure was effected by means of an exposure light source for semiconductor "Mask Alignment Device MA-10" (produced by Mikasa K.K.) using an ultra-high pressure mercury lamp with the center wavelength in the vicinity of 365 nm and a light energy of 12 mW/cm² at the irradiated surface for 20 seconds. After exposure, development was practiced in the sonication cleaning machine with the use of 1,1,1-trichloroethane for 45 seconds. The resolution of the resin composition after development was found to reproduce accurately the line-/interval patterns with 50 μm widths.

Next, the substrate was dried by heating and post exposure of 10J/cm² was practiced. For the substrate, the cross-cut tape peel-off test was practiced with the use of cellophane tape for industrial use. As a result, 100/100 adhesiveness was exhibited, with complete adhesion except for the clear scars of the crosscuts.

Also, the substrate was dipped in an NaOH aqueous solution of pH=9.0, and boiling was practiced for 4 hours. After the boiling test, the cross-cut tape peel-off test and the peel-off test at the 50 μm pattern portion were practiced. As a result, in either test no lowering in adhesiveness such as peel-off, rising, etc., was seen at all. Also, no denaturation such as whitening of the coating was recognized at all.

EXAMPLE 2

By solution polymerization of methyl methacrylate, butoxymethylacrylamide and Nissocure UM-1*3 in methyl cellosolve (methyl methacrylate/butoxymethylacrylamide/Nissocure UM-1=50/15/35) a linear polymer having heat crosslinkability with a weight average molecular weight of $8.7 \times 10^4$ was obtained (this is called P-2).

*3: product name of Shin Nisso Kako K.K., having the structural formula:

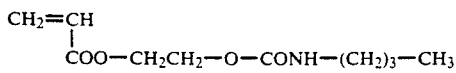

By use of this linear polymer P-2, an active energy ray-curing resin composition was prepared as follows:

| | |
|---|---|
| P-2 | 100 parts by weight |
| KAYARAD DPCA-60*4 | 50 parts by weight |
| Acrylic acid ester of adearesin EPU-6*5 | 100 parts by weight |
| Benzophenone | 9 parts by weight |
| Michler's ketone | 3 parts by weight |
| Paratoluenesulfonic acid | 2.5 parts by weight |
| Crystal Violet | 0.5 parts by weight |
| Methyl cellosolve | 300 parts by weight |

*4 aliphatic polyfunctional acrylic oligomer produced by Nippon Kayaku K.K.
*5 urethane-modified epoxy resin produced by Asahi Denka K.K.

By use of this composition, a pattern of 50 μm lines and intervals with a film thickness of 40 μm was formed in the same manner as in Example 1 on a 10 cm × 10 cm Pyrex substrate. After drying of the developer by evaporation, post-exposure was practiced by use of the same light source for 10 minutes. Then, heat treatment was practiced at 150° C. for 15 minutes.

The substrate having the cured pattern thus formed was dipped in an aqueous NaOH solution of pH=9.0 to practice boiling test for 4 hours. After completion of the boiling test, the substrate was washed with water and dried and then the crosscut tape peel-off test and the peel-off test at the pattern portion were practiced. As the result, adhesiveness was found to be 100/100 and there was no peel-off of the pattern portion.

EXAMPLES 3-10

By use of the linear polymers P-1 and P-2 obtained in the above examples, active energy ray-curing resin compositions as shown in Table 1 were prepared (Nos. 3-10).

By use of these compositions, patterns of 50 μm lines and intervals with film thickness of 40 μm were formed in the same manner as in Example 1 on 10 cm × 10 cm Pyrex glass substrates. After drying by evaporation of the developer, post-exposure was practiced by use of the same light source for 10 minutes. Then, heat treatment was practiced at 150° C. for 15 minutes.

The substrate having the cured pattern thus formed was dipped in an aqueous NaOH solution of pH=9.0 to practice boiling test for 4 hours. After completion of the boiling test, the substrate was washed with water and dried and then the crosscut tape peel-off test and the peel-off test at the pattern portion were practiced. As the result, in all of Nos. 3-10, adhesiveness was found to be 100/100 and there was no peel-off of the pattern portion.

COMPARATIVE EXAMPLE 1

Methyl methacrylate, 2-hydroxyethyl methacrylate and butyl acrylate (=60/30/10 molar ratio) were polymerized in methyl isobutyl ketone to obtain a thermoplastic linear polymer compound with a weight average molecular weight of $8.8 \times 10^4$ (this is called LP-1).

An active energy ray-curing resin composition was prepared and pattern formation was effected in the same manner as in Example 1 except for using LP-1.

The pattern obtained had a resolution substantially similar to that in Example 1. However, in the boiling test, peel-off of the pattern from the substrate occurred before initiation of peel-off test, thus exhibiting low water resistance and adhesiveness.

COMPARATIVE EXAMPLE 2

Methyl methacrylate, tetrahydrofurfuryl acrylate and butoxymethylacrylamide (=75/15/10) were polymerized in methyl isobutyl ketone to obtain a linear polymer compound having heat curability with a weight average molecular weight of $1.2 \times 10^5$ (this is called LP-2). An active energy ray-curing resin composition was prepared and pattern formation was effected in the same manner as in Example 1 except for using LP-2 in place of P-1.

The pattern obtained had a resolution substantially similar to Example 1. However, in the boiling test, peel-off of the pattern from the substrate occurred before initiation of peel-off test, thus exhibiting low adhesiveness.

As is apparent from the Examples and Comparative examples, the active energy ray-curing resin composition of the present invention can form a pattern of high resolution and at the same time has high adhesiveness to a substrate, having also excellent mechanical strength and chemical resistance.

TABLE 1

| Example No. | 3 | 4 | 5 | 6 | 7 | 8 | 9 | 10 |
|---|---|---|---|---|---|---|---|---|
| Linear polymer P-1 | 100 | 100 | 100 | 100 | | | | |
| Linear polymer P-2 | | | | | 100 | 100 | 100 | 100 |
| Epoxy ester 4000A *7 | 150 | | | | 150 | | | |
| Epoxy ester 3002A *8 | | 150 | | | | 150 | | |
| Epoxy ester FR1500A *9 | | | 150 | | | | 150 | |
| Epoxy ester 100MFA *10 | | | | 150 | | | | 150 |
| Benzophenone | 9 | 9 | 9 | 9 | 9 | 9 | 9 | 9 |
| Michler's ketone | 3 | 3 | 3 | 3 | 3 | 3 | 3 | 3 |
| P-toluenesulfonic acid | 2.5 | 2.5 | 2.5 | 2.5 | 2.5 | 2.5 | 2.5 | 2.5 |

TABLE 1-continued

| Example No. | 3 | 4 | 5 | 6 | 7 | 8 | 9 | 10 |
|---|---|---|---|---|---|---|---|---|
| Crystal Voilet | 0.5 | 0.5 | 0.5 | 0.5 | 0.5 | 0.5 | 0.5 | 0.5 |

*7~*10 Epoxy resins having the following formulae esterified with acrylic acid
*7 4000A Hydrogenated bisphenol A diglycidylether

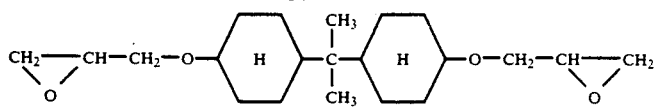

*8 3002A (Bisphenol A added with 2 mols of propyleneoxide) diglycidylether

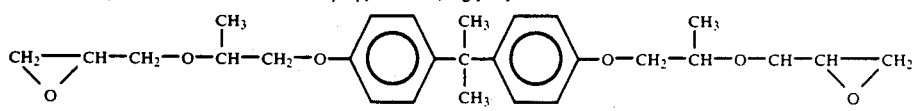

*9 FR1500A 2,2-dibromoneopentylglycol diglycidylether

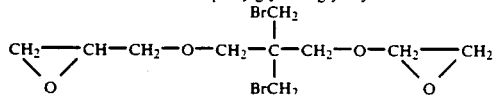

*10 100MFA trimethylolpropane triglycidylether

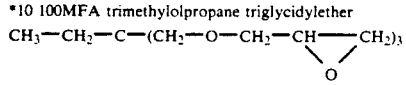

We claim:

1. An active energy ray-curing resin composition comprising (i) a heat-crosslinkable linear copolymer comprising (a) 5 to 30 mol % of a monomer represented by the general formula I shown below and (b) 5 to 50 mol % of a monomer represented by the general II shown below as the copolymer constituents:

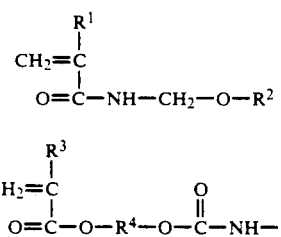

(wherein $R^1$ is hydrogen or alkyl or hydroxyalkyl group having 1 to 3 carbon atoms; $R^2$ is hydrogen or alkyl or acyl group having 1 to 4 carbon atoms which may have a hydroxyl group; $R^3$ is hydrogen or alkyl group having 1 to 3 carbon atoms; $R^4$ is a divalent hydrocarbon group which may have internally an ether bond and may also be substituted with halogen atoms; and $R^5$ is alkyl having 3 to 12 carbon atoms or phenylalkyl group or phenyl group), and (ii) a monomer having an ethylenically unsaturated bond.

2. An active energy ray-curing resin composition according to claim 1, wherein 20 to 80 parts by weight of said heat crosslinkable linear copolymer (i) and 80 to 20 parts by weight of said monomer having an ethylenically unsaturated bond (ii) are contained.

3. An active energy ray-curing resin composition according to claim 1, wherein the monomer represented by the above general formula I is selected from the group of acrylamide derivatives consisting of: N-methylol(meth)acrylamide, N-propoxymethyl(meth)acrylamide, N-n-butoxymethyl(meth)acrylamide, β-hydroxyethoxymethyl(meth)acrylamide, N-ethoxymethyl(meth)acrylamide, N-methoxymethyl(meth)acrylamide, N-acetoxymethyl(meth)acrylamide, α-hydroxymethyl-N-methylolacrylamide, α-hydroxyethyl-N-butoxymethylacrylamide, α-hydroxypropyl-N-propoxymethylacrylamide, α-ethyl-N-methylolacrylamide, and α-propyl-N-methylolacrylamide.

4. An active energy ray-curing resin composition according to claim 1, wherein the monomer represented by the above general formula II is an (α-alkyl)acrylic acid ester having at least one urethane bond in one molecule, and is obtained from the reaction of an (α-alkyl)acrylic acid ester having one hydroxyl group in one molecule with a monoisocyanate compound.

5. An active energy ray-curing composition according to claim 1, further comprising a photopolymerization initiator in the amount of 0.01 to 20 parts by weight per 100 parts by weight of the total amount of said linear copolymer (i) and said monomer having an ethylenically unsaturated bond (ii).

* * * * *

UNITED STATES PATENT AND TRADEMARK OFFICE
CERTIFICATE OF CORRECTION

PATENT NO. : 5,043,363
DATED : August 27, 1991
INVENTOR(S) : HIROMICHI NOGUCHI, ET AL.        Page 1 of 2

It is certified that error appears in the above-identified patent and that said Letters Patent is hereby corrected as shown below:

IN [56] REFERENCES CITED

U.S. PATENT DOCUMENTS, "3,607,977  9/1971  Taylor" should read --3,607,977  9/1971  Taylor et al.--.

COLUMN 7

Line 23, "caploractone-modified" should read --caprolactone-modified--.
Line 24, "tetrahydrofurfulyl" should read --tetrahydrofurfuryl--.

COLUMN 12

TABLE 1,

"

| TABLE 1 | | | | | | | |
|---|---|---|---|---|---|---|---|
| Example No. | 3 | 4 | 5 | 6 | 7 | 8 | 9 |
| Epoxy | ester 3002A *8 | | 150 | | | | 150 |

"

should read

--

| TABLE 1 | | | | | | | |
|---|---|---|---|---|---|---|---|
| Example No. | 3 | 4 | 5 | 6 | 7 | 8 | 9 |
| Epoxy ester 3002A *8 | | | 150 | | | 150 | |

--.

UNITED STATES PATENT AND TRADEMARK OFFICE
CERTIFICATE OF CORRECTION

PATENT NO. : 5,043,363
DATED : August 27, 1991
INVENTOR(S) : HIROMICHI NOGUCHI, ET AL.

Page 2 of 2

It is certified that error appears in the above-identified patent and that said Letters Patent is hereby corrected as shown below:

COLUMN 13

Line 28, "general II" should read --general formula II--.

Signed and Sealed this

Sixth Day of April, 1993

Attest:

STEPHEN G. KUNIN

Attesting Officer

Acting Commissioner of Patents and Trademarks